United States Patent [19]

Kim

[11] Patent Number: 5,318,925
[45] Date of Patent: Jun. 7, 1994

[54] METHOD OF MANUFACTURING A SELF-ALIGNED INTERLAYER CONTACT IN A SEMICONDUCTOR DEVICE

[75] Inventor: Jae K. Kim, Kyoungki, Rep. of Korea

[73] Assignee: Hyundai Electronics Industries Co., Ltd., Kyoungki, Rep. of Korea

[21] Appl. No.: 86,721

[22] Filed: Jul. 2, 1993

[30] Foreign Application Priority Data

Jul. 3, 1992 [KR] Rep. of Korea .................. 92-11844

[51] Int. Cl.⁵ .................. H01L 21/283; H01L 21/31
[52] U.S. Cl. ............................. 437/195; 437/43; 437/228; 437/984
[58] Field of Search .............. 437/195, 52, 984, 228, 437/41, 43; 748/DIG. 20

[56] References Cited

U.S. PATENT DOCUMENTS

| | | | |
|---|---|---|---|
| 4,851,365 | 7/1989 | Jeuch | 437/43 |
| 5,081,060 | 1/1992 | Kim | 437/52 |
| 5,149,665 | 9/1992 | Lee | 437/43 |
| 5,219,793 | 6/1993 | Cooper et al. | 437/195 |
| 5,262,352 | 11/1993 | Woo et al. | 437/189 |

FOREIGN PATENT DOCUMENTS 1-248536 10/1989 Japan .................. 437/195
2239559A 7/1991 United Kingdom .................. 437/229

Primary Examiner—T. N. Quach
Attorney, Agent, or Firm—Merchant, Gould, Smith, Edell, Welter & Schmidt

[57] ABSTRACT

Described is a method of manufacturing a self-aligned interlayer contact in a semiconductor device. To carry out the etching process of the conducting material easily and to minimize the space occupied by the contact, the invention uses the following steps: a field oxide layer and a source/drain electrode are formed on a semiconductor substrate; then, a first interlayer insulating layer is formed over the substrate and, over it, a bit line is formed; then, a second interlayer insulating layer and a charge storage electrode contact mask are formed over the entire structure; then, the insulating layer on upper part of the bit line that had been exposed by the charge storage electrode contact mask is completely etched, and, for other parts, an insulating layer having a certain thickness is left on the upper part of the source/drain electrode; then, a charge storage electrode contact is formed on the source electrode and the side wall of the bit line is exposed on the side wall of the charge storage electrode contact; finally, an insulating layer for spacers is formed on the side wall of the bit line to expose the source/drain electrode in order to form a charge storage electrode.

5 Claims, 7 Drawing Sheets

METHOD OF MANUFACTURING A SELF-ALIGNED INTERLAYER CONTACT IN A SEMICONDUCTOR DEVICE

FIELD OF THE INVENTION

This invention relates to the field of a semiconductor device and more particularly to a method of manufacturing a self-aligned interlayer contact in a semiconductor device.

BACKGROUND OF THE INVENTION

In the manufacture of a semiconductor device, several contacting process are required. For example, in the semiconductor device in which a first conducting line, a first interlayer insulating layer, a second conducting line, a second interlayer insulating layer and a third conducting line are formed sequentially, it is often the case that said third conducting line is connected to the first conducting line after passing through the second conducting line. In this case, in order to insulate the first and third conducting lines from the second conducting line, contact areas for the third conducting line and the first conducting line must maintain a certain distance from the second conducting line. Accordingly, contact masks for the third conducting line and the second conducting line must follow a certain design rule during the manufacturing process. That is, in the design of the third conducting line contact mask that is used to contact the third conducting line to the first conducting line, the contact for the third conducting line must maintain a certain distance from the second conducting line. Therefore, since the registration, critical dimension variation, misalignment tolerance and lens distortion generated during the masking process, as well as the thickness of insulation layer between the third conducting layer contact and the second conducting layer must be considered carefully, the size of the contact increases. Accordingly, the problem of increased space caused by the requirement to maintain a certain distance between the third conducting line contact mask and the second conducting line mask is solved by a self-aligned contact forming method. As a result, the space occupied by the contact is reduced as the distance between the third conducting line contact mask and the second conducting line mask are decreased. However, if the conventional self-aligned contact forming method is used, a vertical topological difference becomes so great that etching away the conducting material for the third conducting line becomes a difficult process. Also, the other conventional method that tries to solve this problem restricts the amount of space to be reduced.

FIG. 1 is a plane view of the semiconductor device during the forming of the self-aligned contact. For the sake of convenience, only a charge storage electrode contact C, bit line B, and source/drain electrode A are illustrated.

FIG. 2A through FIG. 2D are cross sectional views shown along I—I of FIG. 1 that illustrate the manufacturing steps of the semiconductor device using a conventional self-aligned method. As shown in FIG. 2A, a field oxide layer 2 is formed on certain part of the semiconductor substrate 1 and a source/drain electrode 3 on the active area. After that, a first interlayer insulating layer 4, conducting material 5 for bit lines, and a second interlayer insulating layer 6 are formed sequentially.

Next, as shown in FIG. 2B, said second interlayer insulating layer 6, conducting material 5 for bit lines, and the first interlayer insulating layer 4 are etched sequentially using a bit line mask to form a bit line 5'. Then, an insulating layer 7 for side wall spacer is formed on the side wall of said bit line 5' for insulation purpose. Then, a photoresist layer is coated to form a charge storage electrode contact mask 8. FIG. 2B shows that the charge storage electrode contact mask 8 is misaligned as much as the distance created while the masking process. Therefore, said charge storage electrode contact mask 8 does not cover the bit line 5' completely.

As shown in FIG. 2C, the insulating layer 7 for a spacer is etched to a certain thickness using the charge storage electrode contact mask 8 to expose the source/drain electrode 3 so that insulation layers 6 and 7' is left on top and side wall of the bit line 5' for insulation purpose. And then, a conducting material 9 for a charge storage electrode is formed over the entire structure and a charge storage electrode mask 10 is formed. The figure shows a drastic topological difference caused by the above-said first interlayer insulating layer 4, bit line 5', and the second interlayer insulating layer 6. Also, it indicates the part 40 where the most drastic topological difference may take place during etching the conducting material 9 for the charge storage electrode.

FIG. 2D is a cross sectional view illustrating the forming of a charge storage electrode 9' by etching the conducting material for the charging storage electrode using the charge storage electrode mask 10. As shown in the figure, residual 49 of the conducting material is left on the part experiencing a great topological difference caused by said first interlayer insulating layer 4, the bit line 5', and the second interlayer insulating layer 6. The residual 49 may the other conducting lines during the later processes, causing defects in semiconductor device.

As described so far, when the conventional method of forming the self-aligned contact is used, occurrence of a great topological difference becomes a serious problem.

FIG. 3A through FIG. 3C are cross sectional views shown along I—I of FIG. 1 that illustrate the manufacturing steps of the semiconductor device in accordance with another conventional method. This method has decreased the topological difference so that the conducting material for the charge storage electrode can be etched more easily.

Referring to FIG. 3A, a field oxide layer 2 is formed on a certain part of the substrate 1 of the semiconductor device. Then, a first interlayer insulating layer 4 and a bit line 5' are formed after forming a source/drain electrode 3. Next, a second interlayer insulating layer 16 is formed and flattened. Then, a photoresist layer is coated to form a contact mask 8 for the charge storage electrode. FIG. 3A shows that said charge storage electrode contact mask 8 is misaligned and does not cover the bit line 5' completely.

FIG. 3B is a cross sectional view that illustrates the following: the source/drain electrode 3 is exposed by etching the second interlayer insulating layer 16 and the first interlayer insulating layer 4 using said charge storage electrode contact mask 8; then, an insulating layer 17 for spacers is formed on the entire side wall of the bit line 5'.

As shown in the figure, the bit line 5' is misaligned as much as the distance created during the masking process so that some of the upper part and side wall of the bit line 5' is exposed as much as the part not being covered with said charge storage electrode contact mask 8 when the insulating layers 16 and 4 are etched. If the insulating layer 17 for said spacers is thicker than the exposed part of the upper part of said bit line 5', the contact area to be formed on the source/drain electrode 3 is decreased, making the contact with the charge storage electrode difficult. If said insulating layer 17 is less thick than the exposed part, a side wall 50 on the upper part of said insulating layer 17 for spacers will be located on the same vertical plane as the side wall of the exposed bit line 5' will be.

FIG. 3C is a cross sectional view illustrating the forming of the insulating layer spacer 17' on the side wall of said bit line 5' by etching back said insulating layer 17 for spacers. It should be noted that said insulating layer 17 for spacers is less thick than the exposed part of the upper part of said bit line 5', the exposed side wall of said bit line 5' is insulated by the said insulating spacer 17'. However, its top part 50' is not insulated by the insulating spacer 17', causing a short between the charge storage electrode and the bit line in later processes. The prevent this from occurring, the interval between the bit lines of the charge storage electrode contact mask should be reduced to a certain point and no more. If the above described another conventional method is applied, the conducting material for a charge storage electrode can be easily etched due to an improvement in the topological difference. However, it restricts the contact area to be reduced.

SUMMARY OF THE INVENTION

Accordingly, the objectives of the present invention are to provide a self-aligned interlayer contact forming method that can easily carry out an etching process over the conducting material and, at the same time, minimize the space required by the contact device, thereby solving the previously mentioned problems.

For these objectives, the manufacturing method of the present invention is comprising the following steps:

forming a field oxide layer and a source/drain electrode on a semiconductor substrate; forming a first interlayer insulating layer on the substrate; forming a bit line on the first interlayer insulating layer; forming and flattening a second interlayer insulating layer on the bit line; forming a charge storage electrode contact mask on the second interlayer insulating layer; etching said second interlayer insulating layer using the charge storage electrode contact mask to expose a portion of the bit line and leaving at least a portion of said second interlayer insulating layer on the upper part of the source/drain electrode; etching the exposed portion of the bit line completely; etching the remaining second interlayer insulating layer and first interlayer insulating layer to expose the source/drain electrode; forming an insulating layer spacer on a side wall of the exposed bit line; forming a conducting material for a charge storage electrode on the substrate, especially on the exposed source/drain electrode; forming a charge storage electrode mask on the said conducting material for a charge storage electrode; and forming a charge storage electrode by etching said conducting material for a charge storage electrode using the charge storage electrode mask.

DETAILED DESCRIPTION OF THE INVENTION

Figure 1:
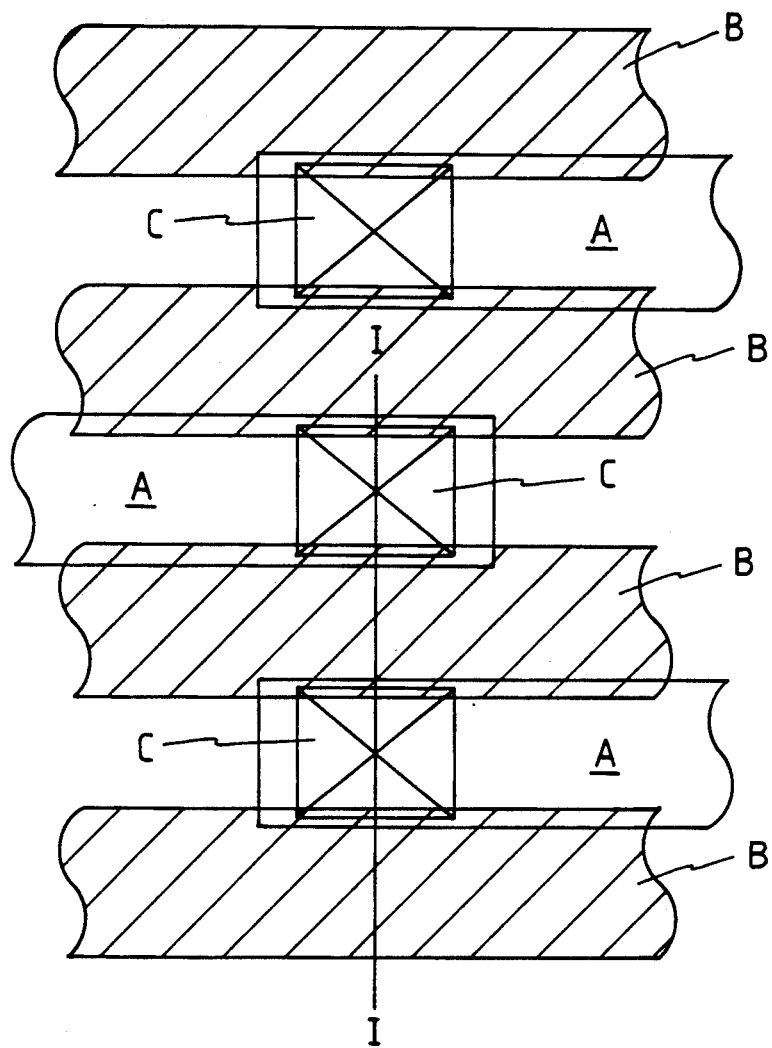
FIG. 1 is a plane view of a semiconductor device during the forming of self-aligned contact.
Figure 2A:
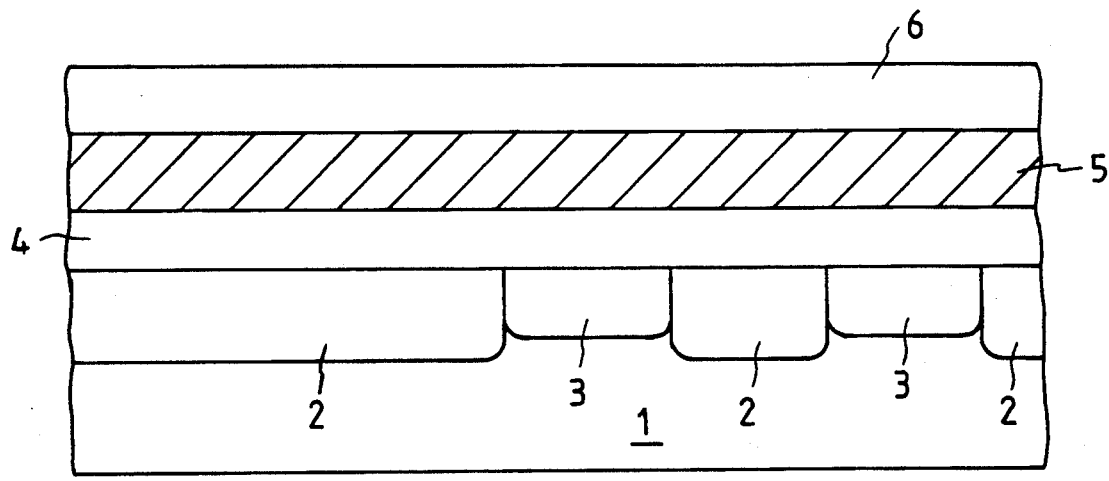
FIG. 2A through FIG. 2D are cross sectional views of the semiconductor device illustrating the manufacturing steps of one conventional self-aligned method.
Figure 2B:
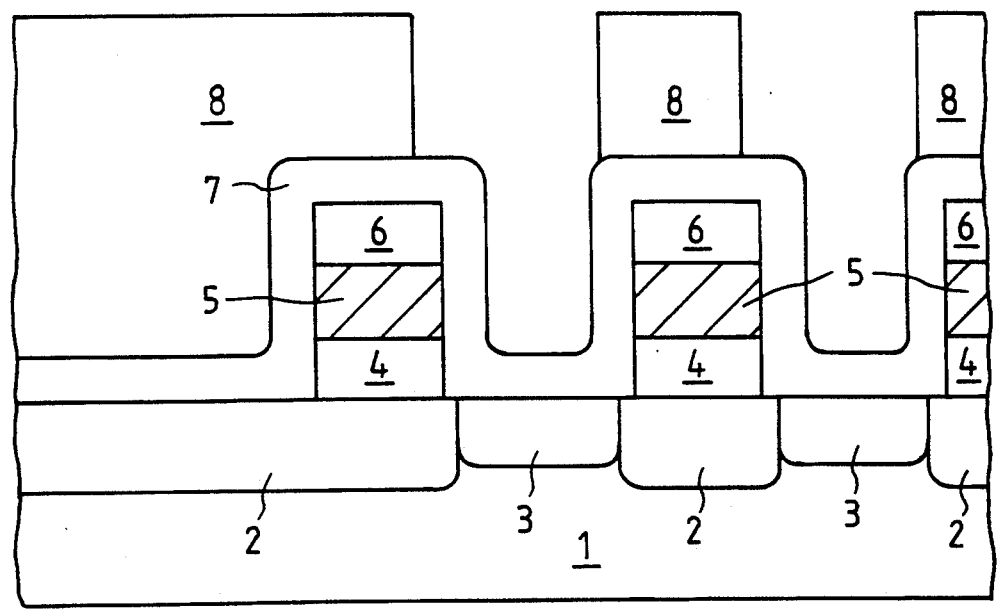
Figure 2C:
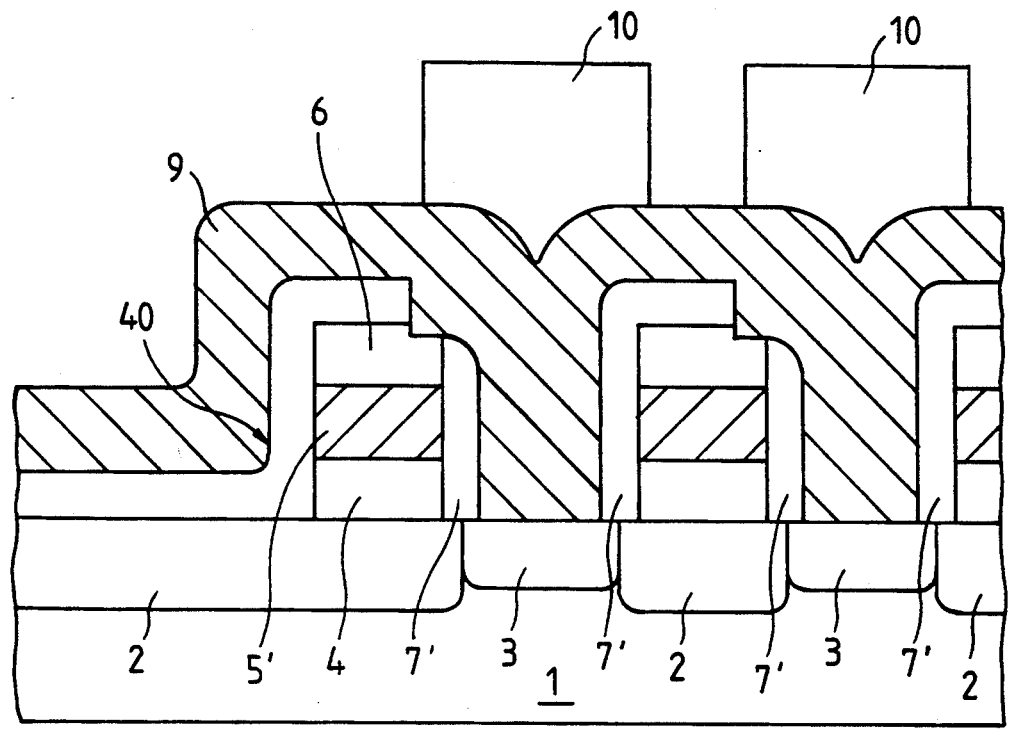
Figure 2D:
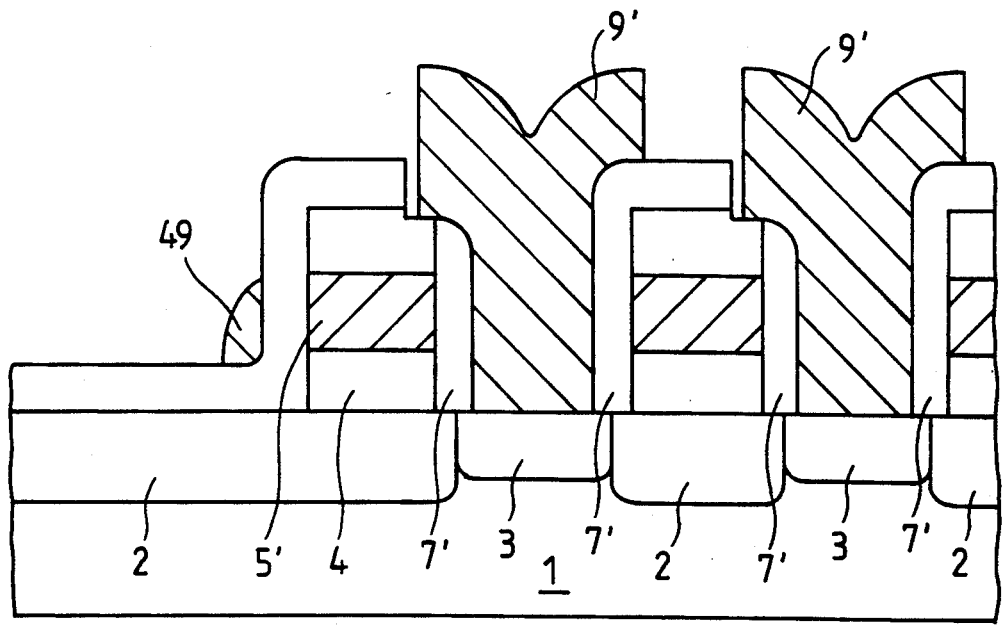
Figure 3A:
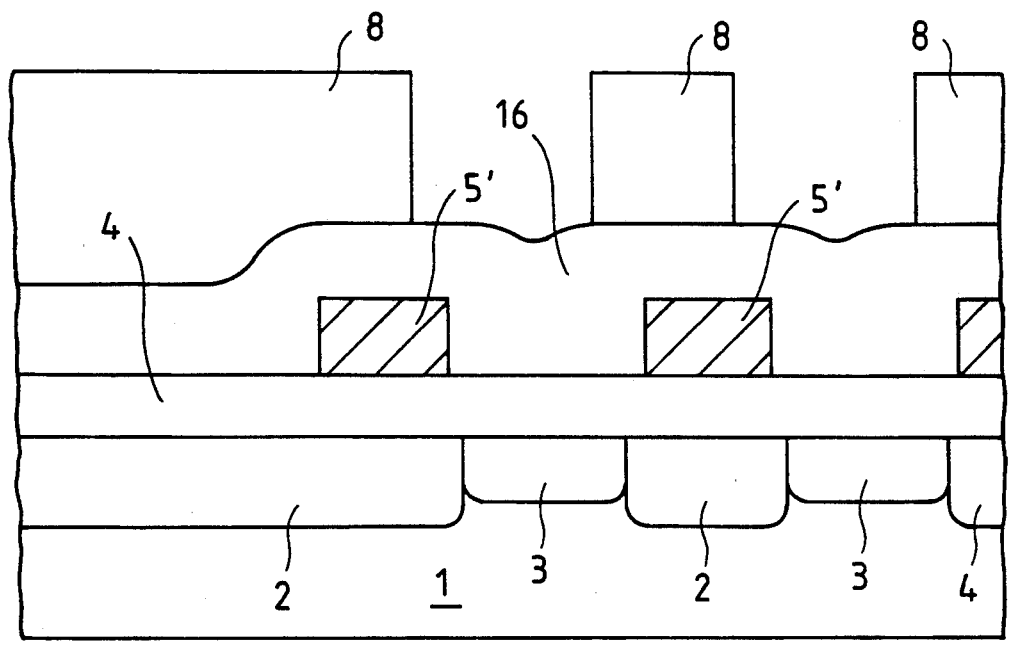
FIG. 3A through FIG. 3C are cross sectional views of the semiconductor device illustrating the manufacturing steps of another conventional self-aligned method.
Figure 3B:
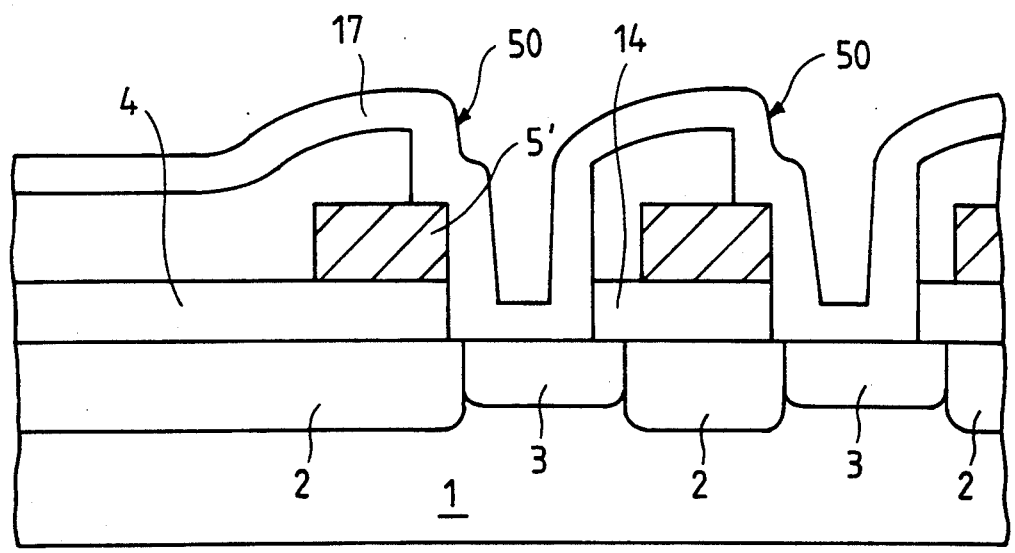
Figure 3C:
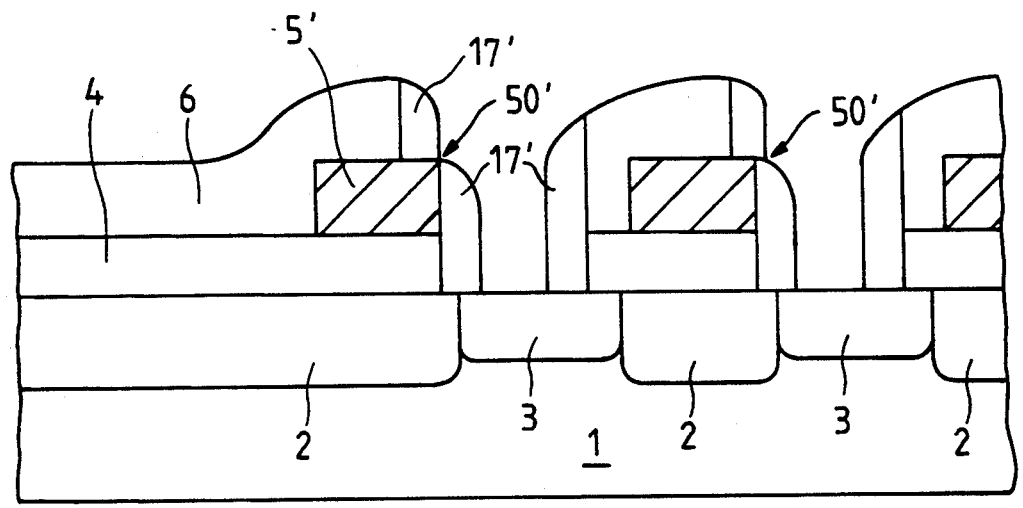
Figure 4A:
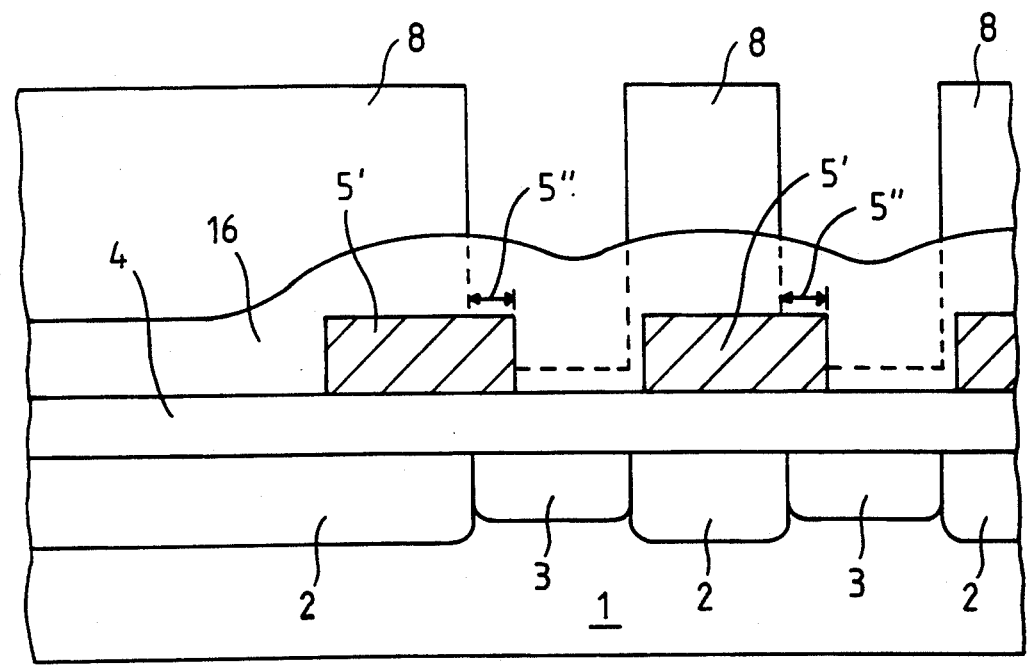
FIG. 4A through FIG. 4D are cross sectional views illustrating the manufacturing steps of the semiconductor device according to the present invention.

Referring to FIG. 4A, a field oxide layer 2 is formed on certain part of a substrate 1 of a semiconductor device. Then, a source/drain electrode 3 is formed. Next, a bit line 5' is formed after forming a first interlayer insulating layer 4. Then, a second interlayer insulating layer 16 is formed and flattened. After coating a photoresist layer, a charge storage electrode contact mask 8 is formed. The above-said second interlayer insulating layer 16 is flattened in order to etch easily a conducting material for a charge storage electrode to be formed later. Said second interlayer insulating layer comprises BPSG (Boro-Phospho-Silicate Glass) or a double structure having USG (Undoped-Silicate-Glass) and BPSG. At this time, even if said second interlayer insulating layer 16 does not flattened completely, because the topological difference caused by the flattening process is much less than that of the conventional method created by the first interlayer insulating layer 4, the bit line 5', and the second interlayer insulating layer, the conducting material for a charge storage electrode can be easily etched. It should be noted that said charge storage electrode contact mask 8 is misaligned with the bit line 5' as much as the distance generated during the masking process. As a result, said charge storage electrode contact mask 8 does not cover the upper part of the bit line 5' completely.

Figure 4B:
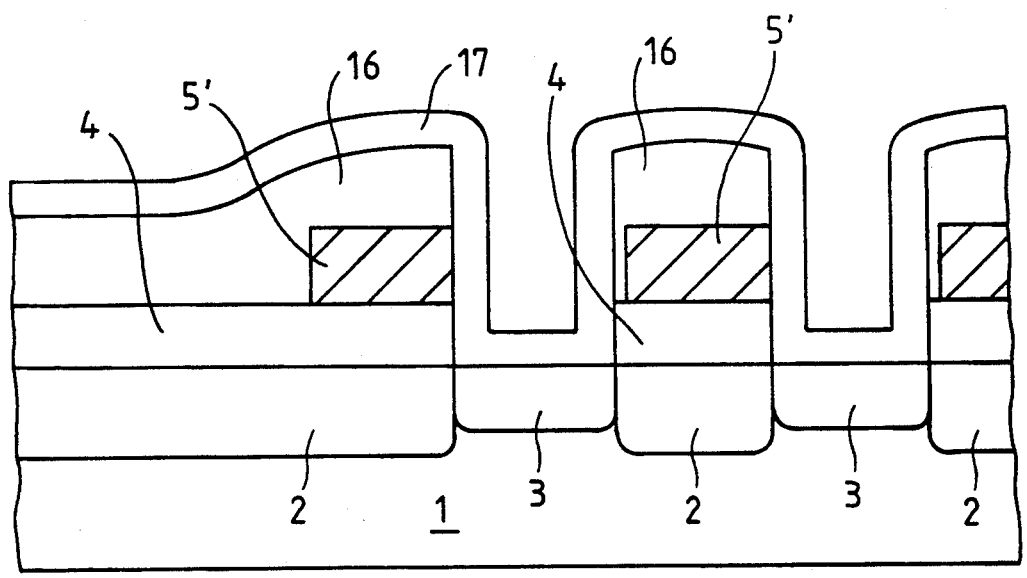

Thereafter, said second interlayer insulating layer 16 is etched by using said charge storage electrode contact mask 8 in such a way that the insulating layer on the upper part of the bit line 5' is completely etched. However, on the upper part of the source/drain electrode 3, insulating layers 4 and 16 having a certain thickness are left. And then, the exposed bit line 5' is etched and the remaining insulating layers 4 and 16 are etched to expose the source/drain electrode 3. Next, as shown in FIG. 4B, an insulating layer 17 for spacers is formed on the entire device for an insulation purpose.

Figure 4C:
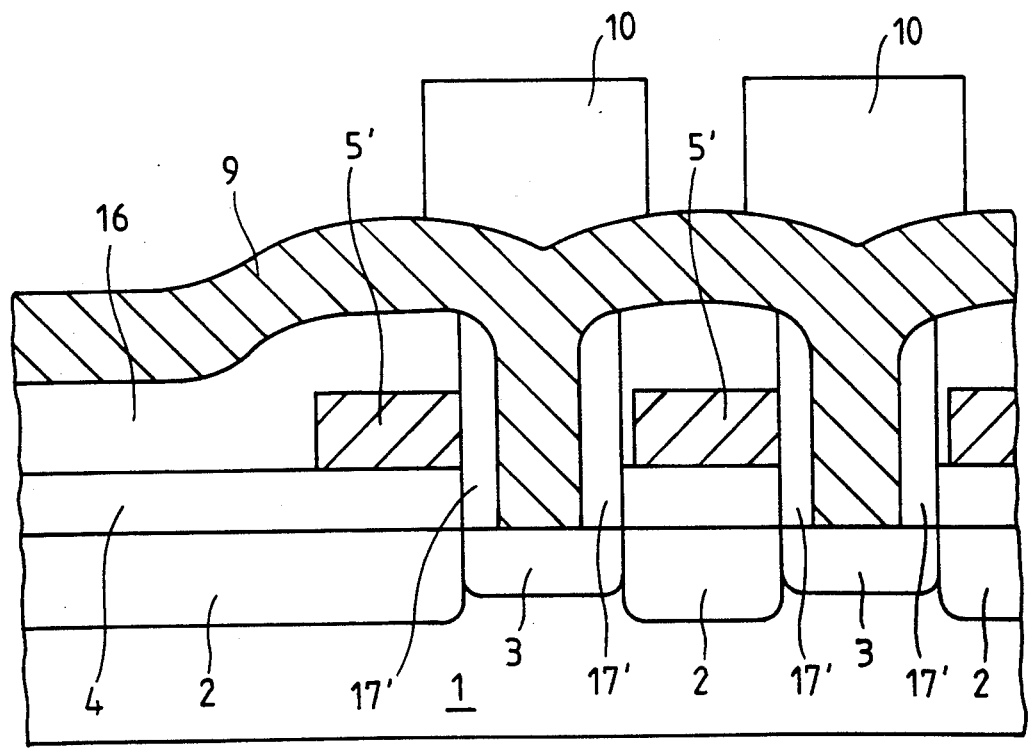

The insulating layer 17 for spacers is etched back to form an insulating layer spacer 17' on the side wall of the exposed bit line and the source/drain electrode 3 is exposed. And then, as in FIG. 4C, a conducting material 9 for a charge storage electrode is formed before forming a charge storage electrode mask 10. Said second interlayer insulating layer 16 is adequately flattened so that said conducting material 9 for the charge storage electrode can be easily etched. Also, the topological difference created is much smaller than that of the conventional method since it is created by the bit line 5' only. Therefore, the conducting material 9 for a charge storage electrode can be easily etched.

Figure 4D:
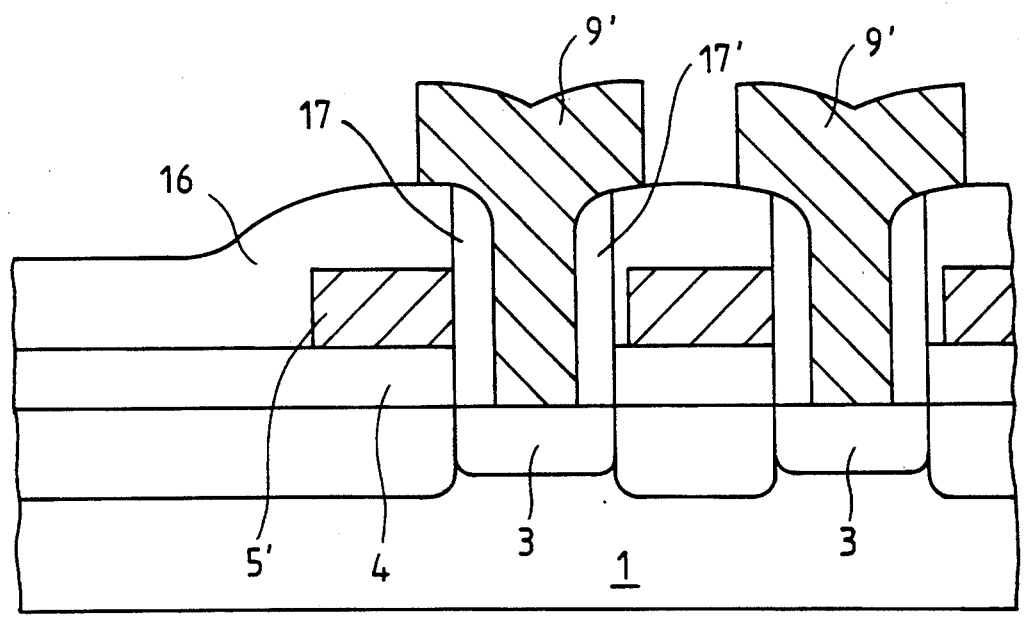

FIG. 4D is a cross sectional view that illustrates the forming of a charge storage electrode 9' by etching the conducting material a using the charge storage electrode 10. Since the second interlayer insulating layer is flattened, problems related to the residual of the conducting material for the charge storage electrode during an etching process are completely solved.

As described so far, the embodiments of the present invention reduces the topological difference created when the convention method is applied, thereby the etching process of the conducting material for the charge storage electrode can be easily carried out, reducing greatly the area occupied by the contact in the semiconductor device.

What is claimed is:

1. A method of manufacturing a self-aligned interlayer contact in a semiconductor device, comprising the steps of:

forming a field oxide layer and a source/drain electrode on a semiconductor substrate;
   forming a first interlayer insulating layer on the substrate;
   forming a bit line on the first interlayer insulating layer;
   forming and flattening a second interlayer insulating layer on the bit line;
   forming a charge storage electrode contact mask on the second interlayer insulating layer;
   etching said second interlayer insulating layer using the charge storage electrode contact mask to expose a portion of the bit line and leaving at least a portion of said second interlayer insulating layer on the upper part of the source/drain electrode;
   etching the exposed portion of the bit line completely;
   etching the remaining second interlayer insulating layer and the first interlayer insulating layer to expose the source/drain electrode;
   forming an insulating layer spacer on a side wall of the exposed bit line;
   forming a conducting material for a charge storage electrode on the substrate, especially on the exposed source/drain electrode;
   forming a charge storage electrode mask on said conducting material for a charge storage electrode; and
   forming a charge storage electrode by etching said conducting material for the charge storage electrode using the charge storage electrode mask.

2. The method according to claim 1 wherein said second interlayer insulating layer has a flattened structure.

3. The method according to claim 1 wherein said second interlayer insulating layer comprises BPSG.

4. The method according to claim 1 wherein said second interlayer insulating layer comprises a double structure having USG and BPSG.

5. A method of manufacturing a self-aligned interlayer contact in a semiconductor device, comprising the steps of:

forming a field oxide layer and a first conducting line on a semiconductor substrate;
   forming a first interlayer insulating layer on the substrate;
   forming a second conducting line on the first interlayer insulating layer;
   forming and flattening a second interlayer insulating layer on the second conducting line;
   forming a third conducting line contact mask on the second interlayer insulating layer;
   etching said second interlayer insulating layer using the third conducting line contact mask to expose a portion of the second conducting line and leaving at least a portion of said second interlayer insulating layer on the upper part of the first conducting line;
   etching the exposed portion of the second conducting line completely;
   etching the remaining second interlayer insulating layer and the first interlayer insulating layer to expose the first conducting line;
   forming an insulating layer spacer on a side wall of the exposed second conducting line;
   forming a conducting material for a third conducting line on the substrate, especially on the exposed first conducting line electrode;
   forming a third conducting line mask on said conducting material for a third conducting line; and
   forming a third conducting line by etching said conducting material for third conducting line using the third conducting line mask.

* * * * *